(12) United States Patent
Kim et al.

(10) Patent No.: US 9,087,907 B2
(45) Date of Patent: Jul. 21, 2015

(54) THIN FILM TRANSISTOR AND METHOD OF MANUFACTURING THE SAME

(71) Applicant: Samsung Electronics Co., Ltd., Suwon-Si, Gyeonggi-Do (KR)

(72) Inventors: Hyun-suk Kim, Hwaseong-si (KR); Sun-jae Kim, Seoul (KR); Tae-sang Kim, Seoul (KR); Myung-kwan Ryu, Yongin-si (KR); Joon-seok Park, Yongin-si (KR); Kyoung-seok Son, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/162,873

(22) Filed: Jan. 24, 2014

(65) Prior Publication Data

US 2015/0034942 A1     Feb. 5, 2015

(30) Foreign Application Priority Data

Aug. 5, 2013 (KR) ........................ 10-2013-0092667

(51) Int. Cl.
*H01L 29/10* (2006.01)
*H01L 29/786* (2006.01)
*H01L 29/66* (2006.01)

(52) U.S. Cl.
CPC ...... *H01L 29/7869* (2013.01); *H01L 29/66742* (2013.01)

(58) Field of Classification Search
None
See application file for complete search history.

(56) References Cited

U.S. PATENT DOCUMENTS

| 7,927,713 | B2 | 4/2011 | Ye |
| 8,143,093 | B2 * | 3/2012 | Ye ................................ 438/104 |
| 2010/0301343 | A1 * | 12/2010 | Qiu et al. ..................... 257/66 |
| 2011/0163310 | A1 * | 7/2011 | Park et al. ..................... 257/43 |
| 2013/0075731 | A1 | 3/2013 | Han et al. |

FOREIGN PATENT DOCUMENTS

KR         10-0370452  B1      1/2003

* cited by examiner

*Primary Examiner* — Kyoung Lee
(74) *Attorney, Agent, or Firm* — Harness, Dickey & Pierce, P.L.C.

(57) ABSTRACT

According to example embodiments, a thin film transistor (TFT) includes a channel layer including zinc, nitrogen, and oxygen; an etch stop layer on the channel layer; source and drain electrodes respectively contacting both ends of the channel layer; a gate electrode corresponding to the channel layer; and a gate insulating layer between the channel layer and the gate electrode. The etch stop layer includes fluorine. The channel layer may be on the gate electrode.

17 Claims, 5 Drawing Sheets

THIN FILM TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2013-0092667, filed on Aug. 5, 2013, in the Korean Intellectual Property Office, the disclosure of which is incorporated herein in its entirety by reference.

BACKGROUND

1. Field

Example embodiments relate to a thin film transistor and/or a method of manufacturing the same.

2. Description of Related Art

Transistors are widely used as a switching device or a driving device in electronic devices. Since a thin film transistor (TFT) may be manufactured on a glass substrate or a plastic substrate, the TFT is useful for displays such as an organic light-emitting display or a liquid crystal display (LCD). Properties of the TFT may depend on material properties of a channel layer (e.g., a semiconductor layer).

Most of the displays that are currently commercialized use a TFT including a channel layer formed of amorphous silicon (hereinafter, referred to as an amorphous silicon TFT), or a TFT including a channel layer formed of polycrystalline silicon (hereinafter, referred to as a polycrystalline silicon TFT). Since the amorphous silicon TFT has very low charge mobility of about 0.5 $cm^2/Vs$, it may be difficult to increase an operation speed of a display. Also, since the polycrystalline silicon TFT may require processes such as a crystallization process, an impurities injection process, and an activation process, a process of manufacturing the polycrystalline silicon TFT may be more complicated and manufacturing cost is higher than the amorphous silicon TFT. Also, since it may be difficult to ensure uniformity of a polycrystalline silicon layer, if the polycrystalline silicon layer is used as a channel layer of a large display, the image quality of the display may decrease.

In order to implement a high-quality, high-definition, large next-generation display, a TFT exhibiting excellent performance is demanded. In this regard, research related to an oxide TFT, to which an oxide semiconductor having high carrier mobility is applied as a material of a channel layer, is being conducted. However, a conventional oxide TFT may not ensure high reliability. Thus, it is necessary to develop a transistor (TFT) having high mobility and excellent reliability.

SUMMARY

Example embodiments relate to a thin film transistor (TFT) having high mobility and high reliability, and/or a method of manufacturing the TFT.

Additional aspects will be set forth in part in the description which follows and, in part, will be apparent from the description, or may be learned by practice of example embodiments.

According to example embodiments, a thin film transistor (TFT) includes: a channel layer including zinc, nitrogen, and oxygen; an etch stop layer on the channel layer; source and drain electrodes respectively contacting both ends of the channel layer; a gate electrode corresponding to the channel layer; and a gate insulating layer between the channel layer and the gate electrode. The etch stop layer includes fluorine.

In example embodiments, the channel layer may include zinc oxynitride.

In example embodiments, the channel layer may further include an element X in the zinc oxynitride, In example embodiments, the element X may include at least one of at least one cation, at least one anion, and a combination thereof. The element X may include at least one of boron (B), aluminum (Al), gallium (Ga), indium (In), tin (Sn), titanium (Ti), zirconium (Zr), hafnium (Hf), silicon (Si), fluorine (F), chlorine (Cl), bromine (Br), iodine (I), sulfur (S), selenium (Se), and a combination thereof.

In example embodiments, the etch stop layer may be configured to supply fluorine to the channel layer.

In example embodiments, the channel layer may include a first region facing the gate electrode, and a second region facing the etch stop layer. A fluorine concentration of the second region may be greater than a fluorine concentration of the first region.

In example embodiments, a fluorine concentration of the etch stop layer may range from about $4\times10^{18}$ atoms/$cm^3$ to about $2\times10^{20}$ atoms/$cm^3$.

In example embodiments, the etch stop layer may include an insulating material.

In example embodiments, the channel layer may be on the gate electrode.

According to example embodiments, a method of manufacturing a TFT includes: forming a gate electrode on a substrate; forming a gate insulating layer covering the gate electrode on the substrate; forming a channel layer on the gate insulating layer, the channel layer corresponding to the gate electrode, the channel layer including zinc, nitrogen, and oxygen; forming an etch stop layer covering a portion of the channel layer, the etch stop layer including fluorine; and forming source and drain electrodes, respectively, on both ends of the channel layer.

In example embodiments, the channel layer may include zinc oxynitride.

In example embodiments, the channel layer may further include an element X in zinc oxynitride, In example embodiments, the element X may include at least one of at least one cation, at least one anion, and a combination thereof. The element X may include at least one of boron (B), aluminum (Al), gallium (Ga), indium (In), tin (Sn), titanium (Ti), zirconium (Zr), hafnium (Hf), and silicon (Si), fluorine (F), chlorine (Cl), bromine (Br), iodine (I), sulfur (S), and selenium (Se), and a combination thereof.

In example embodiments, the forming the etch stop layer may include supplying fluorine to the channel layer.

In example embodiments, the channel layer may include a first region facing the gate electrode, and a second region facing the etch stop layer. A fluorine concentration of the second region may be greater than a fluorine concentration of the first region.

In example embodiments, a fluorine concentration of the etch stop layer may range from about $4\times10^{18}$ atoms/$cm^3$ to about $2\times10^{20}$ atoms/$cm^3$.

In example embodiments, the etch stop layer may include an insulating material.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. In the drawings.

DETAILED DESCRIPTION

Figure 1:
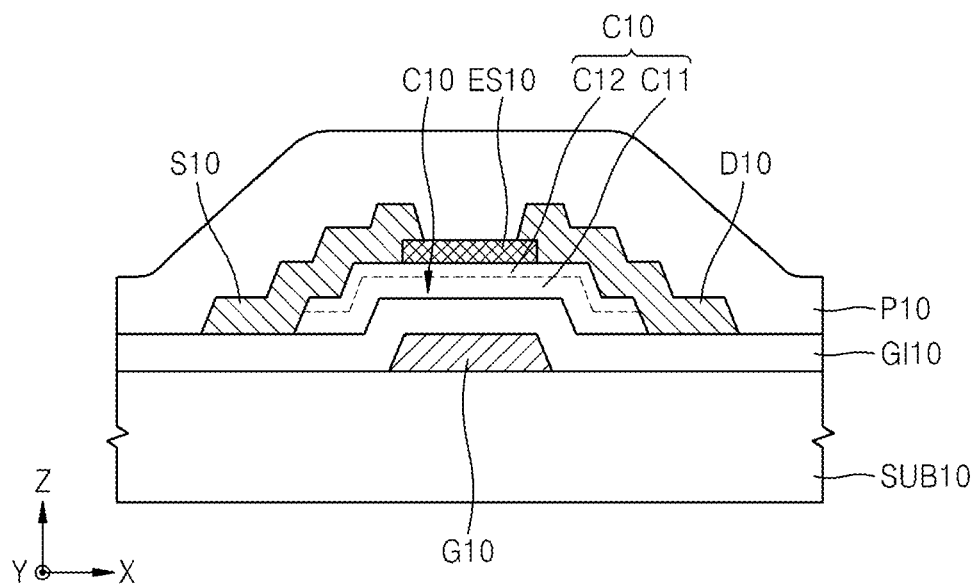
FIG. 1 is a cross-sectional view schematically illustrating a thin film transistor (TFT) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view schematically illustrating a thin film transistor (TFT) according to example embodiments. The TFT in FIG. 1 is a bottom-gate type TFT in which a gate electrode G10 is provided below a channel layer C10.

Referring to FIG. 1, the gate electrode G10 is formed on a substrate SUB10, and a gate insulating layer GI10, the channel layer C10, and an etch stop layer ES10 are sequentially formed in this order on the gate electrode G10. A source electrode S10 and a drain electrode D10 are respectively disposed on both sides of the channel layer C10.

The substrate SUB10 may be formed of various materials that are used in general processes of manufacturing a semiconductor device, such as plastic, glass, and silicon. The substrate SUB10 may be an inorganic material substrate or an organic material substrate, and may be transparent, opaque, or translucent.

The gate electrode G10 may be formed of general electrode materials (metal, alloy, conductive metal oxide, conductive metal nitride, or the like). For example, the gate electrode G10 may be formed of a metal such as titanium (Ti), platinum (Pt), ruthenium (Ru), gold (Au), silver (Ag), molybdenum (Mo), aluminum (Al), tungsten (W), copper (Cu), neodymium (Nd), chromium (Cr), tantalum (Ta), or an alloy thereof; or a conductive oxide such as indium zinc oxide (In—Zn—O; IZO), aluminum zinc oxide (Al—Zn—O, AZO), indium tin oxide (In—Sn—O; ITO), gallium zinc oxide (Ga—Zn—O; GZO), zinc tin oxide (Zn—Sn—O; ZTO), or a combination thereof. The gate electrode G10 may have a single- or a multi-layer structure.

The gate insulating layer GI10 may include a silicon oxide ($SiO_2$) layer, a silicon oxynitride ($SiO_xN_y$) layer, or a silicon nitride ($Si_3N_4$) layer. Alternatively, the gate insulating layer GI10 may include other material layers such as a high dielectric material (e.g., $HfO_2$, $Al_2O_3$, etc.) layer having a dielectric constant that is greater than that of a $Si_3N_4$ layer. The gate insulating layer GI10 may have a structure in which at least two of the $SiO_2$ layer, the $SiO_xN_y$ layer, the $Si_3N_4$ layer, and the high dielectric material layer are stacked.

The channel layer C10 may be provided on the gate electrode G10 so as to face the gate electrode G10. A material of the channel layer C10 may include zinc, oxygen, and nitrogen. The channel layer C10 may include zinc oxynitride (ZnON).

The channel layer C10 may be a ZnON-based material, ZnON:X. X is an additional element that is added to ZnON. The additional element X may include at least one cation from among boron (B), aluminum (Al), gallium (Ga), indium (In), tin (Sn), titanium (Ti), zirconium (Zr), hafnium (Hf), and silicon (Si); or include at least one anion from among fluorine (F), chlorine (Cl), bromine (Br), iodine (I), sulfur (S), and selenium (Se); or include at least one of the cation and at least one of the anion. For example, the channel layer C10 may include ZnON including fluorine (ZnON:F).

A thickness of the channel layer C10 (Z-direction thickness) may range from about 10 nm to about 150 nm, for example, about 20 nm to about 100 nm. However, a range of the thickness of the channel layer C10 may vary. A width of the channel layer C10 (X-direction width) may be greater than a width of the gate electrode G10. However, in some cases, the width of the channel layer C10 may be similar to or less than the width of the gate electrode G10.

The etch stop layer ES10 may include an insulating material and fluorine. By including the insulating material, the etch stop layer ES10 may limit (and/or prevent) the channel layer C10 from being damaged during an etching process. For example, the etch stop layer ES10 may limit (and/or prevent) that channel layer from being damaged during an etching process used to form the source and drain electrodes S10 and D10. Also, since the etch stop layer ES10 includes fluorine, the channel layer C10 may be more stable.

The insulating material of the etch stop layer ES10 may include $SiO_2$, $SiO_xN_y$, or $Si_3N_4$. Alternatively, the insulating material thereof may include other materials having a higher dielectric constant than $Si_3N_4$, such as a high dielectric material ($HfO_2$, $Al_2O_3$, etc.) layer.

The etch stop layer ES10 contacts the channel layer C10, and supplies fluorine to the channel layer C10. Since the etch stop layer ES10, including fluorine, contacts the channel layer C10, fluorine may be largely supplied to a portion of the channel layer C10.

The channel layer C10 includes a first region C11 facing the gate electrode G10 and a second region C12 facing the etch stop layer ES10. In the figures, a region between the first and second regions C11 and C12 is marked with a dashed line to easily distinguish the first and second regions C11 and C12. However, the dashed line is only an imaginary line, and is not limited thereto. Since the etch stop layer ES10 contacts the second region C12 of the channel layer C10 and largely supplies fluorine to the second region C12, a fluorine concentration of the second region C12 may be greater than a fluorine concentration of the first region C11. Due to the disposition structure, the second region C12 may be more sensitive to an external environment than the first region C11. Thus, in a TFT that does not include an etch stop layer ES10 including fluorine, the second region C12 of the channel layer C10 may deteriorate. However, in example embodiments, the deterioration of the channel layer C10 may be reduced (and/or prevented) by increasing the fluorine concentration of the second region C12. Fluorine increases the stability of a ZnON-based channel layer C10. However, if an amount of fluorine is excessively provided in the channel layer C10, mobility may decrease. In this regard, in example embodiments, the fluorine concentration of the first region C11, which directly affects the mobility of the channel layer C10, is relatively low, and the fluorine concentration of the second region C12 is relatively high. Thus, the mobility of the TFT, including the channel layer C10, may not be decreased and stability may be improved. For example, the TFT may have a field effect mobility of about 10 $cm^2$/Vs or more, and have a 2-hour threshold voltage variation $\Delta V_{TH}$ of about 2 V or less.

The fluorine concentration of the etch stop layer ES10 may range from about $4\times10^{18}$ atoms/$cm^3$ to about $2\times10^{20}$ atoms/$cm^3$. If the fluorine concentration of the etch stop layer ES10 is less than about $4\times10^{18}$ atoms/$cm^3$, for example, when fluorine is partially included as an impurity, since a sufficient amount of fluorine may not be provided to the channel layer C10, the stability of the channel layer C10 may not be improved. Thus, the 2-hour threshold voltage variation $\Delta V_{TH}$ may be more than about 2 V. On the contrary, if the fluorine concentration of the etch stop layer ES10 is more than about $2\times10^{20}$ atoms/$cm^3$, fluorine supplied by the etch stop layer ES10 may penetrate into the first region C11 that directly affects mobility, and decrease mobility. Therefore, the field effect mobility of the TFT may be less than about 10 $cm^2$/Vs.

The etch stop layer ES10 may supply fluorine to a channel interface between the channel layer C10 and the gate insulating layer GI10. Fluorine supplied to the channel interface may stabilize properties of the channel layer C10 and improve the reliability of the TFT.

A width of the etch stop layer ES10 may be less than the width of the channel layer C10. The both sides of the channel layer C10 may not be covered by the etch stop layer ES10.

Materials of the source and drain electrodes S10 and D10 may be the same as or similar to that of the gate electrode G10. For example, the source and/or drain electrodes S10 and D10 may be formed of a metal such as Ti, Pt, Ru, Au, Ag, Mo, Al, W, Cu, Nd, Cr, Ta, or an alloy thereof; or a conductive oxide such as IZO, AZO, ITO, GZO, ZTO, or a combination thereof. The source electrode S10 may contact an edge of the channel layer C10 and extend to an edge of the etch stop layer ES10. The drain electrode D10 may contact the other edge of the channel layer C10 and extend to the other edge of the etch stop layer ES10. During the etching process for forming the source and drain electrodes S10 and D10, the etch stop layer ES10 may limit (and/or prevent) the channel layer C10 from being damaged due to the etching. The source and drain electrodes S10 and D10 may have a single- or a multi-layer structure.

A passivation layer P10 that covers the etch stop layer ES10, the source electrode S10, and the drain electrode D10 may be provided on the gate insulating layer GI10. The passivation layer P10 may be formed as a $SiO_2$ layer, a $Si_3N_4$ layer, or an organic layer, or have a structure in which two or more thereof are stacked. For example, the passivation layer P10 may have a single-layer structure formed of $SiO_2$ or $Si_3N_4$; or a multi-layer structure formed of a $SiO_2$ layer and a $Si_3N_4$ layer provided on the $SiO_2$ layer. Alternatively, the passivation layer P10 may have a multi-layer structure having 3 layers or more. Thicknesses of the gate electrode G10, the gate insulating layer GI10, the source and drain electrodes S10 and D10, and the passivation layer P10 may respectively range from about 50 nm to about 300 nm, about 50 nm to about 400 nm, about 10 nm to about 200 nm, about 10 nm to about 200 nm, and about 50 nm to about 1200 nm. However, ranges of the thicknesses may vary according to circumstances.

Analysis and Evaluation

Figure 2A:
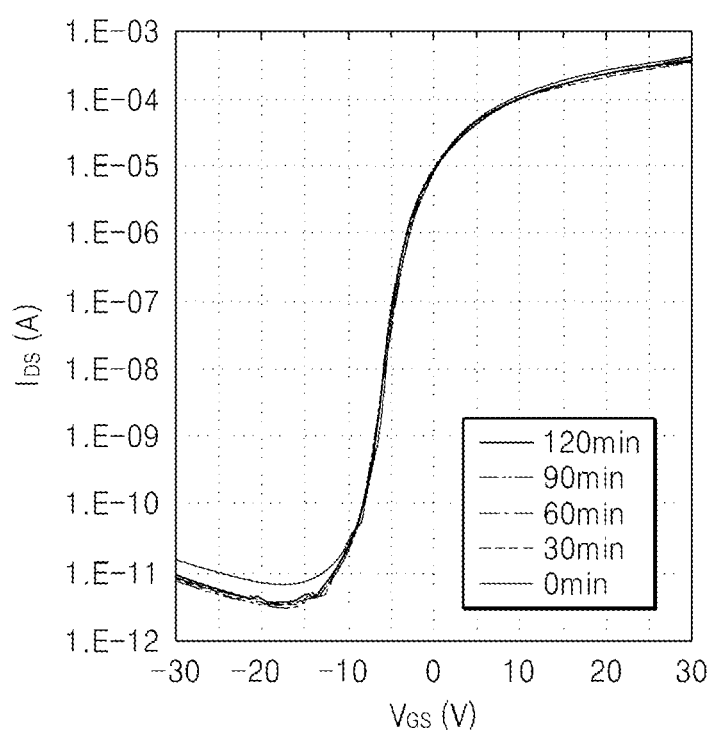
FIG. 2A is a graph illustrating a voltage ($V_{GS}$)-current ($I_{DS}$) property of the TFT of FIG. 1 in which an etch stop layer, including fluorine, is provided.
Figure 2B:
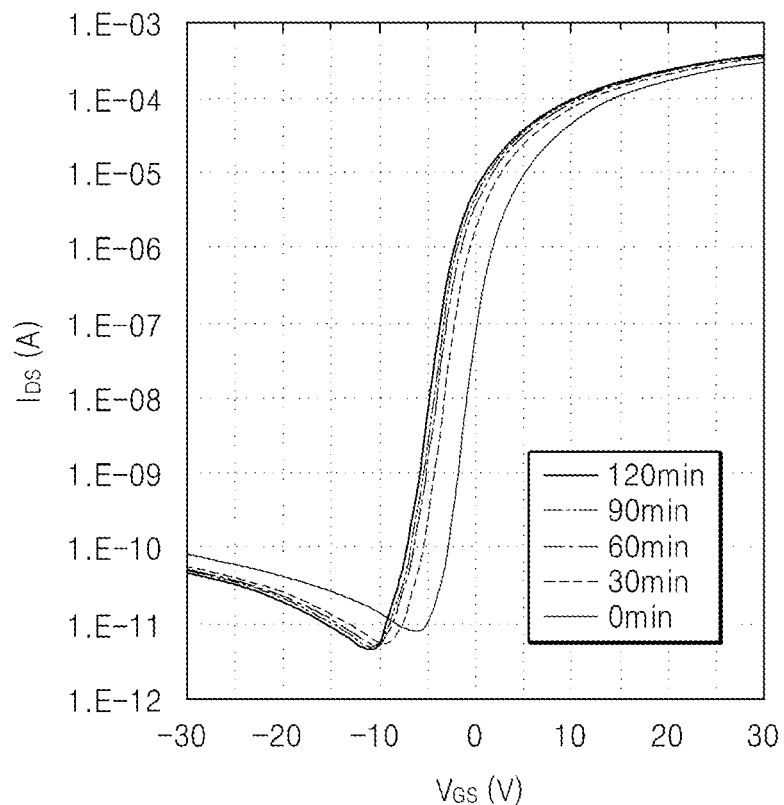
FIG. 2B a graph illustrating a voltage ($V_{GS}$)-current ($I_{DS}$) property of a TFT according to a comparative example in which an etch stop layer not including fluorine is provided.

FIG. 2A is a graph illustrating a voltage ($V_{GS}$)-current ($I_{DS}$) property of the TFT according to example embodiments of FIG. 1 in which an etch stop layer, including fluorine, is provided. FIG. 2B is a graph illustrating a voltage ($V_{GS}$)-current ($I_{DS}$) property of a TFT according to a comparative example in which an etch stop layer not including fluorine is provided.

The TFTs of FIGS. 2A and 2B are different in that the etch stop layer ES10 in FIG. 2A includes fluorine and the etch stop layer in FIG. 2B does not include fluorine. However, other elements such as the substrate SUB10, the gate electrode G10, the gate insulating layer GI10, the channel layer C10, and the source and drain electrodes S10 and D10 are the same (and/or substantially the same). The passivation layer P10 is omitted in the TFTs. Specifically, in the TFTs of FIGS. 2A and 2B, the substrate SUB10 formed of glass; the gate insulating layer GI10 having a structure in which a silicon oxide layer and a silicon nitride layer are stacked; the gate electrode G10 formed of molybdenum; the source and drain electrodes S10 and D10 formed of aluminum-neodymium (AlNd); and the channel layer C10 including zinc oxynitride including fluorine (ZnON:F) are used in common. The etch stop layer ES10 of the TFT of FIG. 2A includes fluorine and $SiO_2$, whereas the etch stop layer ES10 of the TFT of FIG. 2B includes $SiO_2$. The respective voltage ($V_{GS}$)-current ($I_{DS}$) properties of the TFTs described above were measured for 2 hours at 30 minute intervals.

Referring to FIG. 2A, in the TFT that includes the etch stop layer ES10 including fluorine, the 2-hour threshold voltage variation $\Delta V_{TH}$ is about 0.36 V; and a voltage variation $\Delta V1_{nA}$ when a 2-hour current ($I_{DS}$) is 1 nA is about 0.43 V. However, referring to FIG. 2B, in the TFT including the etch stop layer ES10 without fluorine, the 2-hour threshold voltage variation $\Delta V_{TH}$ is about 4.04 V; and the voltage variation $\Delta V1_{nA}$ when a 2-hour current ($I_{DS}$) is 1 nA is about 3.94 V. The 2-hour threshold voltage variation $\Delta V_{TH}$ and the voltage variation $\Delta V1_{nA}$ when a 2-hour current ($I_{DS}$) is 1 nA in the TFTs of FIGS. 2A and 2B are listed in Table 1.

TABLE 1

|  | $\Delta V_{TH}$ (V) | $\Delta V_{1nA}$ (V) |
| --- | --- | --- |
| TFT according to example embodiments | 0.36 | 0.43 |
| Comparative Example | 4.04 | 3.94 |

According to example embodiments, by providing the etch stop layer ES10 including fluorine compared to the etch stop layer ES10 not including fluorine, a threshold voltage variation and a voltage variation at a desired (and/or alternatively predetermined) current may be substantially reduced even when time elapses. Therefore, the TFT that includes the etch stop layer ES10 including fluorine according to example embodiments is highly reliable.

A Method of Manufacturing a Transistor

Hereinafter, a method of manufacturing a TFT according to example embodiments will be described.

FIGS. 3A to 3G are cross-sectional views illustrating a method of manufacturing a TFT, according to example embodiments. FIGS. 3A to 3G relate to a method of manufacturing a bottom-gate type TFT.

Figure 3A:
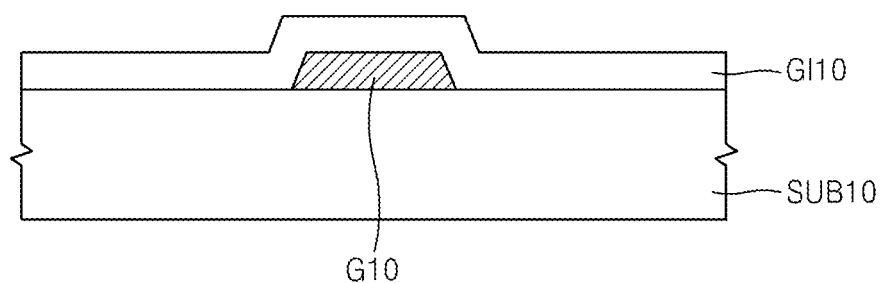
FIGS. 3A to 3G are cross-sectional views illustrating a method of manufacturing a TFT, according to example embodiments.

Referring to FIG. 3A, the gate electrode G10 is formed on the substrate SUB10, and the gate insulating layer GI10 covering the gate electrode G10 is formed. The substrate SUB10 may be a glass substrate, or any other kind of substrates that are used in general processes of manufacturing a semiconductor device, such as a plastic substrate or a silicon substrate. The substrate SUB10 may be an inorganic substrate or an organic substrate, and may be transparent, opaque, or translucent. The gate electrode G10 may be formed of general electrode materials (metal, alloy, conductive metal oxide, conductive metal nitride, or the like). For example, the gate electrode G10 may be formed of a metal such as Ti, Pt, Ru, Au, Ag, Mo, Al, W, Cu, Nd, Cr, Ta, or an alloy thereof; or a conductive oxide such as IZO, AZO, ITO, GZO, ZTO, or a compound thereof. The gate electrode G10 may have a single- or a multi-layer structure. The gate insulating layer GI10 may include a $SiO_2$ layer, a $SiO_xN_y$ layer, or a $Si_3N_4$ layer. Alternatively, the gate insulating layer GI10 may include other material layers such as a high dielectric material ($HfO_2$, $Al_2O_3$, etc.) layer having a dielectric constant that is greater than that of the $Si_3N_4$ layer. The gate insulating layer GI10 may have a structure in which two or more of the $SiO_2$ layer, the $SiO_xN_y$ layer, the $Si_3N_4$ layer, the $Si_3N_4$ layer, and the high dielectric material layer are stacked.

Figure 3B:
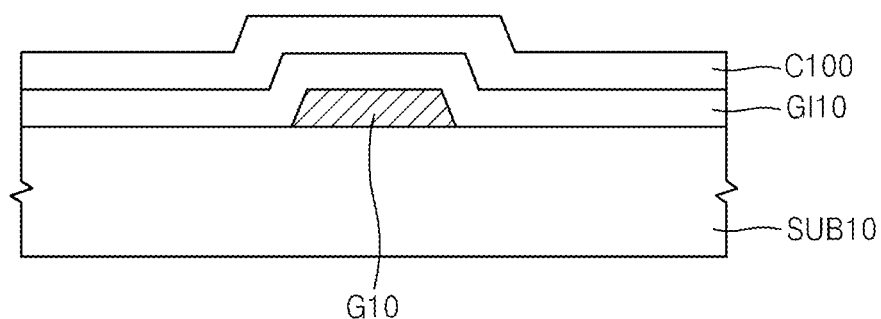

Referring to FIG. 3B, a channel semiconductor C100 may be formed on the gate insulating layer GI10. The channel semiconductor C100 may include zinc, oxygen, or nitrogen. The channel semiconductor C100 may include ZnON. A thickness of the channel semiconductor C100 may range from about 10 nm to 150 nm, for example, about 30 nm to about 100 nm. However, the thickness may range from about 10 nm to about 150 nm, for example, about 30 nm to about 100 nm. However, an appropriate range may vary according to circumstances.

The channel semiconductor C100 may be deposited by using a physical vapor deposition (PVD) method such as a sputtering method. The sputtering method may be a reactive sputtering method or a co-sputtering method which uses a plurality of targets. For example, when the channel semiconductor C100 is formed by using the sputtering method, a Zn target may be used. In this case, nitrogen ($N_2$) gas or oxygen ($O_2$) gas may be used as reactive gas, and additionally, argon (Ar) gas may be used. $N_2$ gas may be a source of nitrogen; $O_2$ gas may be a source of oxygen. Ar gas may function as carrier gas. Also, Ar gas may generate plasma and increase deposition efficiency. The sputtering method may be performed at room temperature or a relatively low temperature (for example, about 25 to about 300° C.). In other words, when forming the channel semiconductor C100 by using the sputtering method, a temperature of the substrate SUB10 may be maintained at room temperature or the relatively low temperature (for example, about 25 to about 300° C.). A pressure of a reaction chamber may range from about 0.05 Pa to about 15 Pa. Sputtering power regarding the Zn target may be tens to thousands of W.

The specific manufacturing conditions described above are provided as examples, and may vary depending on sputtering apparatuses. Also, the above-described method of forming the channel semiconductor C100 may be modified in various ways. For example, the channel semiconductor C100 may be formed by using a method other than the sputtering method, such as a metal organic chemical vapor deposition (MOCVD) method, a chemical vapor deposition (CVD) method, an atomic layer deposition (ALD) method, and an evaporation method.

Figure 3C:
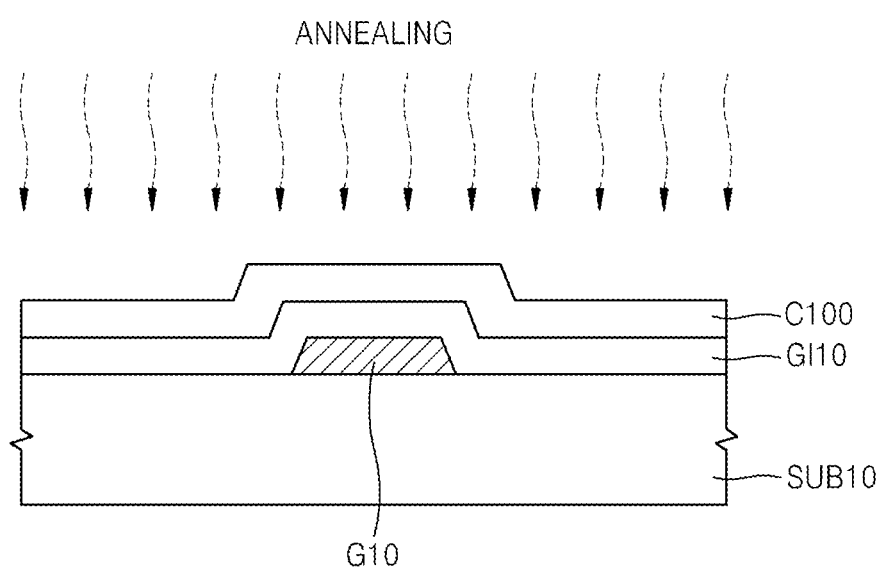

Referring to FIG. 3C, the channel semiconductor C100 may be annealed (e.g., perform a heat treatment). The annealing process may be executed at a temperature of about 450° C. or less, for example, in a range of about 150 to 450° C. Also, the annealing process may be executed in an $N_2$, $O_2$, or air atmosphere. By executing the annealing process, the channel semiconductor C100 may be stabilized. Also, due to the annealing process, a protection layer (not shown) may be thinly formed on a surface of the channel semiconductor C100. The protection layer may be a surface oxidation layer or an oxygen-rich material layer. A density of the protection layer may be greater than a density of a semiconductor layer described below. However, the annealing process is optional, and may not be executed depending on circumstances. Also, timings of the annealing process may vary.

Figure 3D:
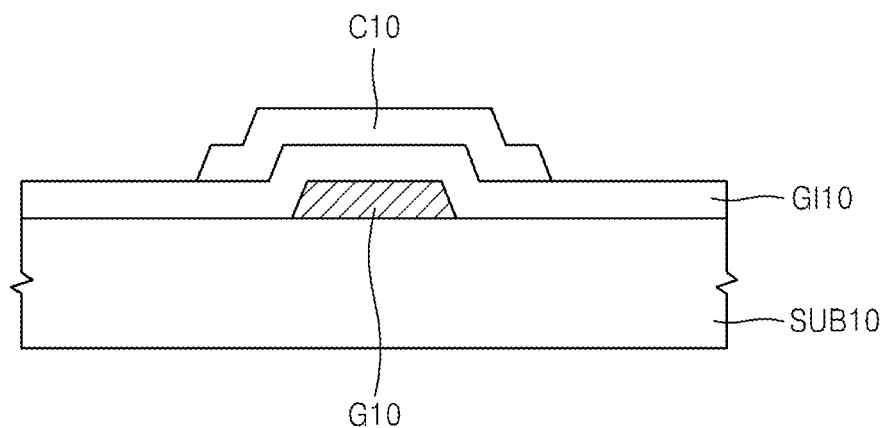

The channel semiconductor C100 may be patterned into the channel layer C10, as illustrated in FIG. 3D. The channel layer C10 may be provided on the gate electrode G10. That is, the channel layer C10 may be disposed to face the gate electrode G10.

Figure 3E:
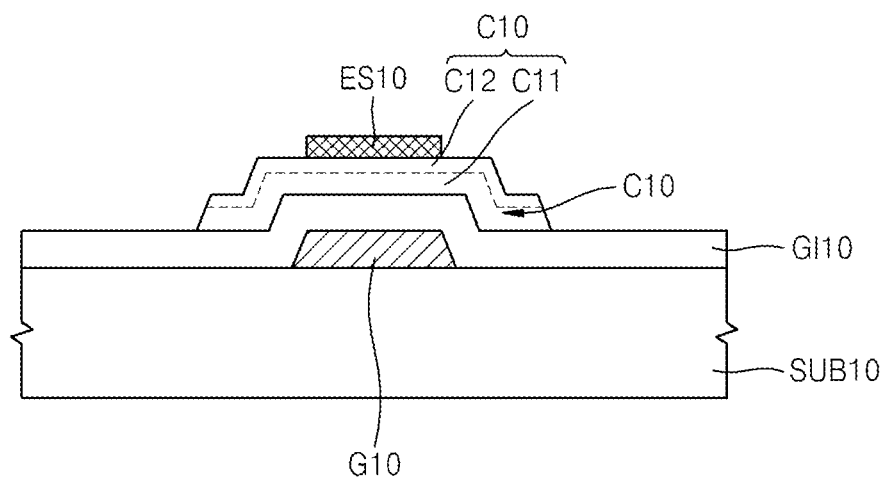

Referring to FIG. 3E, the etch stop layer ES10 may be formed on the channel layer C10. The etch stop layer ES10 may be formed in the center (or a region adjacent to the center) of the channel layer C10. Therefore, portions of the channel layer C10 that are at both sides of the etch stop layer ES10 may be exposed (e.g., not be covered) by the etch stop layer ES10. For example, the etch stop layer ES10 may be completely formed on the channel layer C10, and patterned as illustrated in FIG. 3E.

The etch stop layer ES10 may be based on an insulating material and include fluorine. The insulating material of the etch stop layer ES10 may include $SiO_2$, $SiO_xN_y$, or $Si_3N_4$. Alternatively, the insulating material may include other materials having a dielectric constant that is greater than that of $Si_3N_4$, such as a high dielectric material ($HfO_2$, $Al_2O_3$, etc.) layer. The etch stop layer ES10 contacts the channel layer C10 during the forming process. Thus, the etch stop layer ES10 may supply fluorine to the channel layer C10.

The etch stop layer ES10 may be formed by using, for example, a plasma-enhanced chemical vapor deposition (PECVD) method. In order to include the insulating material and fluorine in the etch stop layer ES10, $SiF_4$ gas and $N_2O$ gas may be used as reactive gas. $SiF_4$ gas may be a source of silicon and fluorine; $N_2O$ gas may be a source of nitrogen (N) and oxygen (O). The PECVD method may be executed at a relatively low temperature, such as in a range from about 200 to about 300° C. The specific manufacturing conditions, for example reactive gas and a chamber temperature, are provided as examples, and may vary if necessary. Also, the above-described method of forming the etch stop layer ES10 may be modified in various ways. For example, the etch stop layer ES10 may be formed by using a method other than the PECVD method, such as a sputtering method, an ALD method, and an evaporation method.

During the process of forming the etch stop layer ES10 including fluorine on the channel layer C10, since fluorine is largely supplied to the second region C12 of the channel layer C10, the fluorine concentration of the second region C12 may be greater than the fluorine concentration of the first region C11. Due to the disposition structure, the second region C12 is more sensitive to an external environment than the first region C11. Thus, in a TFT that does not include an etch stop layer ES10 including fluorine, the second region C12 of the channel layer C10 may deteriorate. However, in example embodiments, the deterioration of the channel layer C10 may be prevented by increasing the fluorine concentration of the second region C12. Fluorine increases the stability of a ZnON-based channel layer C10. However, if an amount of fluorine is excessively provided in the channel layer C10, mobility may decrease. In this regard, in example embodiments, the fluorine concentration of the first region C11, which directly affects the mobility in the channel layer C10, is relatively low, and the fluorine concentration of the second region C12 is relatively high. Thus, the mobility of the TFT, including the channel layer C10, may not be decreased and stability may be improved.

The fluorine concentration of the etch stop layer ES10 may range from about $4 \times 10^{18}$ atoms/cm$^3$ to about $2 \times 10^{20}$ atoms/cm$^3$. If the fluorine concentration of the etch stop layer ES10 is less than about $4 \times 10^{18}$ atoms/cm$^3$, for example, when fluorine is partially included as an impurity, since a sufficient amount of fluorine may not be provided to the channel layer C10, the stability of the channel layer C10 may not be improved. On the contrary, if the fluorine concentration of the etch stop layer ES10 is more than about $2 \times 10^{20}$ atoms/cm$^3$, fluorine supplied by the etch stop layer ES10 penetrates into the first region C11 that directly affects mobility, and decrease mobility.

Figure 3F:
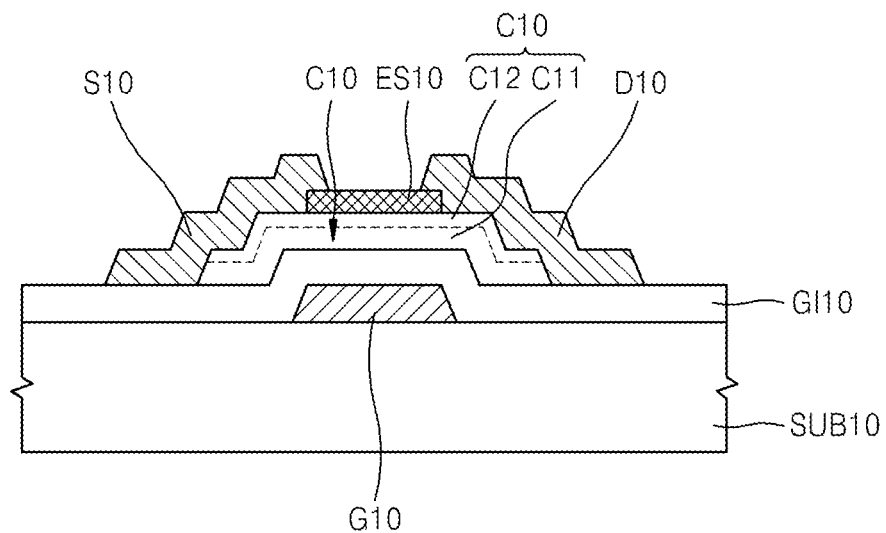

Referring to FIG. 3F, the source and drain electrodes S10 and D10 that respectively contact the both sides of the channel layer C10 are formed on the gate insulating layer GI10. The source electrode 510 may contact an edge of the channel layer C10 and extend to an edge of the etch stop layer ES10. The drain electrode D10 may contact the other edge of the channel layer C10 and extend to the other edge of the etch stop layer ES10. The source and drain electrodes S10 and D10 may be formed by forming a predetermined conductive layer covering the channel layer C10 and the etch stop layer ES10 on the gate insulating layer GI10, and patterning (etch) the conductive layer. In this case, during the etching process for forming the source and drain electrodes S10 and D10, the etch stop layer ES10 may prevent the channel layer C10 from being damaged due to the etching. The source and drain electrodes S10 and D10 may be layers formed of the same material as the material of the gate electrode G10, but may be a layer formed of a different material. As a specific example, the source and drain electrodes S10 and D10 may be formed of a metal such as Ti, Pt, Ru, Au, Ag, Mo, Al, W, Cu, Nd, Cr, Ta, or an alloy thereof; or a conductive oxide such as IZO, AZO, ITO, GZO, ZTO, or a compound thereof. The source and drain electrodes S10 and D10 may be formed of a single- or a multi-layer structure.

Figure 3G:
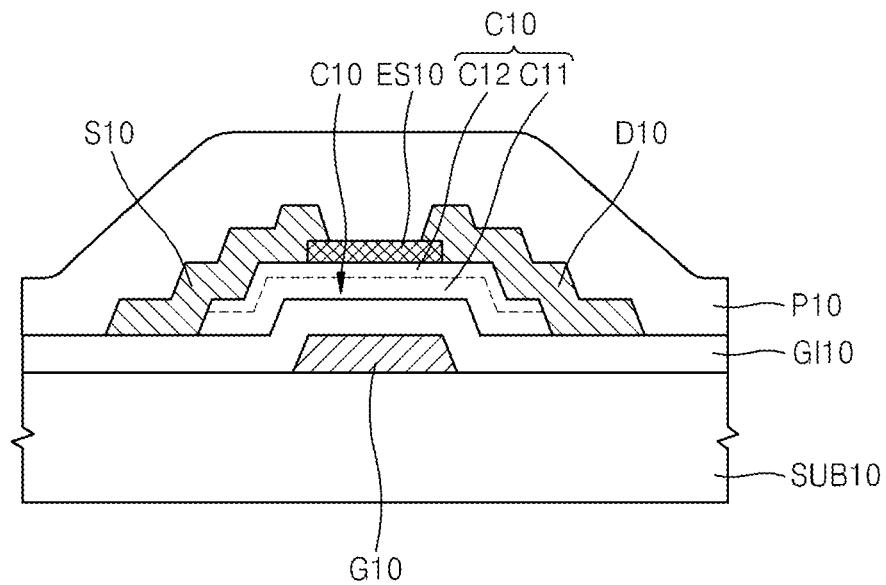

Referring to FIG. 3G, the passivation layer P10 covering the etch stop layer ES10, the source electrode S10, and the drain electrode D10 may be formed on the gate insulating layer GI10. The passivation layer P10 may be formed as a $SiO_2$ layer, a $SiO_xN_y$ layer, a $Si_3N_4$ layer, or an organic layer, or have a structure in which two or more thereof are stacked. Before or after forming the passivation layer P10, an annealing process may be executed.

The manufacturing process of FIGS. 3A to 3G described above is an example of manufacturing the TFT of FIG. 1, and may be modified in various ways.

As described above, according to example embodiments, by forming an etch stop layer including fluorine on a channel layer, fluorine may be supplied to a portion of the channel layer. Thus, a mobility of a TFT may be maintained and the TFT may be highly reliable. In addition, a method of manufacturing a TFT according to example embodiments has been described.

While some example embodiments have been described and illustrated in the attached drawings, it should be understood that example embodiments described herein should be considered in a descriptive sense only and not for purposes of limitation. Accordingly, descriptions of features or aspects within each TFT and/or method of manufacturing a TFT according to example embodiments should typically be considered as available for other similar features or aspects in other TFTs and/or methods of manufacturing TFTs according to example embodiments. It will be understood by one of ordinary skill in the art that variations in form and detail may be made therein without departing from the spirit and scope of the claims.

What is claimed is:

1. A thin film transistor (TFT) comprising:
a channel layer including zinc, nitrogen, and oxygen;
an etch stop layer on the channel layer, the etch stop layer including fluorine;
source and drain electrodes respectively contacting both ends of the channel layer;
a gate electrode corresponding to the channel layer; and
a gate insulating layer between the channel layer and the gate electrode,
wherein the etch stop layer is configured to supply the fluorine to the channel layer.

2. The TFT of claim 1, wherein the channel layer includes zinc oxynitride.

3. The TFT of claim 2, wherein
the channel layer further includes an element X in the zinc oxynitride, and
the element X includes at least one of boron (B), aluminum (Al), gallium (Ga), indium (In), tin (Sn), titanium (Ti), zirconium (Zr), hafnium (Hf), silicon (Si), fluorine (F), chlorine (Cl), bromine (Br), iodine (I), sulfur (S), selenium (Se), and a combination thereof.

4. The TFT of claim 1, wherein
the channel layer includes a first region facing the gate electrode, and a second region facing the etch stop layer, and
a fluorine concentration of the second region is greater than a fluorine concentration of the first region.

5. The TFT of claim 1, wherein a fluorine concentration of the etch stop layer ranges from about $4\times10^{18}$ atoms/cm$^3$ to about $2\times10^{20}$ atoms/cm$^3$.

6. The TFT of claim 1, wherein the etch stop layer includes an insulating material.

7. The TFT of claim 1, wherein the channel layer is on the gate electrode.

8. A thin film transistor (TFT) comprising:
a channel layer including zinc, nitrogen, and oxygen;
an etch stop layer on the channel layer, the etch stop layer including fluorine;
source and drain electrodes respectively contacting both ends of the channel layer;
a gate electrode corresponding to the channel layer; and
a gate insulating layer between the channel layer and the gate electrode, wherein
the channel layer includes zinc oxynitride,
the channel layer further includes an element X in the zinc oxynitride, and
the element X includes at least one of at least one cation, at least one anion, and a combination thereof.

9. The TFT of claim 8, wherein the element X includes at least one of boron (B), aluminum (Al), gallium (Ga), indium (In), tin (Sn), titanium (Ti), zirconium (Zr), hafnium (Hf), silicon (Si), fluorine (F), chlorine (Cl), bromine (Br), iodine (I), sulfur (S), selenium (Se), and a combination thereof.

10. A method of manufacturing a thin film transistor (TFT), the method comprising:
forming a gate electrode on a substrate;
forming a gate insulating layer covering the gate electrode on the substrate;
forming a channel layer on the gate insulating layer, the channel layer corresponding to the gate electrode, the channel layer including zinc, nitrogen, and oxygen;
forming an etch stop layer covering a portion of the channel layer, the etch stop layer including fluorine; and
forming source and drain electrodes, respectively, on both ends of the channel layer,
wherein the forming the etch stop layer includes supplying the fluorine to the channel layer.

11. The method of claim 10, wherein the channel layer includes zinc oxynitride.

12. The method of claim 11, wherein
the channel layer further includes an element X in the zinc oxynitride, and
the element X includes at least one of boron (B), aluminum (Al), gallium (Ga), indium (In), tin (Sn), titanium (Ti), zirconium (Zr), hafnium (Hf), silicon (Si), fluorine (F), chlorine (Cl), bromine (Br), iodine (I), sulfur (S), selenium (Se), and a combination thereof.

13. The method of claim 10, wherein
the channel layer includes a first region facing the gate electrode, and a second region facing the etch stop layer, and
a fluorine concentration of the second region is greater than a fluorine concentration of the first region.

14. The method of claim 10, wherein a fluorine concentration of the etch stop layer ranges from about $4\times10^{18}$ atoms/cm$^3$ to about $2\times10^{20}$ atoms/cm$^3$.

15. The method of claim 10, wherein the etch stop layer includes an insulating material.

16. A method of manufacturing a thin film transistor (TFT), the method comprising:
forming a gate electrode on a substrate;
forming a gate insulating layer covering the gate electrode on the substrate;
forming a channel layer on the gate insulating layer, the channel layer corresponding to the gate electrode, the channel layer including zinc, nitrogen, and oxygen;
forming an etch stop layer covering a portion of the channel layer, the etch stop layer including fluorine; and
forming source and drain electrodes, respectively, on both ends of the channel layer, wherein
the channel layer includes zinc oxynitride,
the channel layer further includes an element X in the zinc oxynitride, and
the element X includes at least one of at least one cation, at least one anion, and a combination thereof.

17. The method of claim 16, wherein the element X includes at least one of boron (B), aluminum (Al), gallium (Ga), indium (In), tin (Sn), titanium (Ti), zirconium (Zr), hafnium (Hf), silicon (Si), fluorine (F), chlorine (Cl), bromine (Br), iodine (I), sulfur (S), selenium (Se), and a combination thereof.

* * * * *